United States Patent [19]
Adachi et al.

[11] Patent Number: 5,987,309
[45] Date of Patent: Nov. 16, 1999

[54] TRANSCEIVER CIRCUITS FOR TDMA SYSTEM WITH VARIABLE FREQUENCY SECOND LOCAL OSCILLATOR

[75] Inventors: Hisashi Adachi, Mino; Hiroaki Kosugi, Hirakara; Youichi Morinaga; Toshio Obara, both of Yokohama, all of Japan

[73] Assignee: Matsushita Electric Industrial Co., Ltd., Osaka, Japan

[21] Appl. No.: 08/668,360

[22] Filed: Jun. 26, 1996

[30] Foreign Application Priority Data

Jul. 3, 1995 [JP] Japan ................................. 7-167191

[51] Int. Cl.$^6$ ...................................... H04B 1/40
[52] U.S. Cl. .............................. 455/86; 375/219; 370/294
[58] Field of Search ................................. 455/86, 87, 84, 455/76; 370/347, 282, 294; 375/219

[56] References Cited

U.S. PATENT DOCUMENTS

| | | |
|---|---|---|
| 4,186,344 | 1/1980 | Higuchi et al. ............................ 455/86 |
| 4,979,170 | 12/1990 | Gilhousen et al. ................. 370/347 X |
| 5,339,309 | 8/1994 | Saito ........................................ 370/282 |
| 5,444,865 | 8/1995 | Heck et al. .............................. 455/86 |
| 5,657,344 | 8/1997 | Na ......................................... 455/86 X |

Primary Examiner—Thomas J. Mullen, Jr.
Attorney, Agent, or Firm—Morrison & Foerster

[57] ABSTRACT

A transceiver circuit with a heterodyne receiver circuit is provided. Output signals of first and second local oscillator 103, 104 are mixed by a local frequency converter 105. An output signal of the converter 105 passes a filter 106 and inputs a modulator 111 of a transmitter circuit 101 as well as a first frequency converter 122 of a receiver circuit 102. The second local oscillator 104 comprises a frequency synthesizer whose output signal varies for a transmission or a receiving mode. The output signal of the second local oscillator 104 also inputs the second frequency converter 124 of the receiving mode. A reference frequency of the second local oscillator 104 is set higher than a frequency step between communication channels so that a quick switching of the frequency is performed. Thus, the transceiver circuit of this invention is suitable for a compact size and hardly generates unwanted spurious components at transmission mode.

13 Claims, 11 Drawing Sheets

5,987,309

TRANSCEIVER CIRCUITS FOR TDMA SYSTEM WITH VARIABLE FREQUENCY SECOND LOCAL OSCILLATOR

FIELD OF THE INVENTION

This invention relates to a heterodyne transceiver circuit for a TDMA (Time Division Multiple Access) system.

BACKGROUND OF THE INVENTION

In the prior art, a heterodyne transceiver circuit changes a communication frequency by changing an output frequency of a first local oscillator. The transceiver circuit has two second local oscillators for receiving and transmitting whose output frequencies are fixed.

FIG. 11 is a block diagram of the heterodyne transceiver circuit in the prior art. This transceiver circuit has a transmitter circuit 901, receiver circuit 902, a first local oscillator 903, a second local oscillator for transmitting 904, a second local oscillator for receiving 905, a diplexer 907, and an antenna 908.

The transmitter circuit 901 has a modulator 911, a filter 912, a frequency converter for transmitting 913, a filter 914, and an amplifier 915. The modulator 911 modulates the output signal of the second local oscillator for transmitting 904 with a base band signal. The output signal of the modulator 911 is provided to the frequency converter for transmitting 913 after passing the filter for reducing unwanted frequency components. The frequency converter for transmitting 913 produces a converted signal having a transmitting frequency by using the output signal of the first local oscillator 903. The output signal of the frequency converter for transmitting 913 is amplified by the amplifier 915 after unwanted frequency components of the signal are reduced by the filter 914. The amplified signal passes through the diplexer 907 and radiates from the antenna 908.

The receiver circuit 902 has a low-noise amplifier 921, a first frequency converter 922, a filter 923, a second frequency converter 924, a filter 925, and a demodulator 926. A signal received by the antenna 908 passes a diplexer 907 and is an input to the low-noise amplifier 921. The output signal of the low-noise amplifier 921 is provided to the first frequency converter 922, which produces a first intermediate frequency using the output signal of the first frequency local oscillator 903. The output signal of the first frequency converter 922 is provided to the second frequency converter 924 after unwanted frequency components of the signal are reduced. The second frequency converter 924 converts the output signal of the filter 923 into a second intermediate frequency using the output signal of the second local oscillator for receiving 905. The second intermediate frequency signal is demodulated by the demodulator 926 after unwanted frequency components of the signal are reduced by the filter 925.

However, the above transceiver circuit in the prior art needs two second local oscillators for receiving and transmitting. Therefore, this transceiver circuit is not suited for a portable transceiver that should be compact in size. The transceiver circuit in the prior art has another disadvantage. It has a tendency to generate unwanted spurious components due to the output signal of the second local oscillator at the transmission mode, as both second local oscillators are enabled during communication operation.

SUMMARY OF THE INVENTION

An advantage of this invention is to provide an improved transceiver circuit that is suitable for a compact size and hardly generates unwanted spurious components at transmission mode, by using a single second local oscillator both for receiving and transmitting.

According to this invention, a transceiver circuit with a variable frequency second local oscillator is provided, wherein the second local oscillator has a frequency synthesizer circuit. A reference frequency of the second local oscillator is set higher than a frequency step of communication channels, and the output frequency of the second local oscillator is changed for a transmission mode or a receiving mode.

In a preferred embodiment, both output signals of the first and second local oscillators are received by a local frequency converter. In the transmission mode, the output of the local frequency converter is an input to a modulator of a transmitter circuit as a carrier frequency of a transmission signal. While in the receiving mode, the output frequency of the second local oscillator varies a predetermined amount from the transmission mode, and the output signal of the local frequency converter is furnished to the first frequency converter so that the received signal is converted into the first intermediate frequency signal. In this case, it is more preferable that the first local oscillator has a first oscillator circuit and a multiplier, and that the output of the first oscillator circuit is multiplied in the multiplier, and then furnished to the local frequency converter.

In another preferred embodiment, the output signal of the first local oscillator is furnished to the first frequency converter so that the received signal is converted into the first intermediate frequency signal in the receiving mode. While in the transmission mode, the output frequency of the second local oscillator varies a predetermined amount from the receiving mode and the local frequency converter mixes output signals of the first and second local oscillators to produce a converted signal for a carrier of transmission signals. The carrier is given to the modulator of the transmitter circuit. In this case, it is more preferable that an intermediate value between the output frequency of the first local oscillator and the frequency of transmission signal is equal to the frequency of the received signal, and that the second local oscillator has an oscillator circuit and a multiplier. The output signal of the oscillator circuit is provided to the second frequency converter in the receiving mode. While in the transmission mode, the output frequency of the oscillator circuit is doubled by the multiplier. The doubled frequency signal is an input to the local frequency converter.

In another preferred embodiment, in the receiving mode, the output signal of the first local oscillator is provided to the first frequency converter so that the received signal is converted into the first intermediate signal, and the first intermediate signal is an input to the second frequency converter to be converted into the second intermediate frequency. The second intermediate frequency is equal to a differential frequency between the first intermediate frequency and the output frequency of the second local oscillator. While in the transmission mode, the output frequency of the second local oscillator varies a predetermined amount from the receiving mode and the signal is furnished to the modulator of the transmitter circuit. The output signal of the modulator is converted into a transmission frequency signal by a transmission frequency converter using the output signal of the first local oscillator.

According to this invention, it is not necessary to provide the transceiver with two second local oscillators as in the prior art, since the transceiver circuit of this invention uses a single second local oscillator with changing the output frequency thereof during a short period for transfer between the transmission mode and the receiving mode in the TDMA system. Moreover, the transceiver circuit of this invention hardly generates unwanted spurious components as the output signal of the second local oscillator does not exist in the transmission mode.

This invention can also be applied to a transceiver circuit used in plural communication bands in which a differential frequency between a received signal and a transmission signal varies. In this case, one of the plural communication bands is selected according to the output frequency of the first local oscillator, and the output frequency of the second local oscillator is fixed in the receiving mode and varies according to each communication band in the transmission mode.

It is preferable that the first and second local oscillators store data for setting output frequencies and select one of them to output the corresponding frequency signal when a transmit/receive switch signal is given. Thus, the transmission mode and the receiving mode can be switched by a few switch signals, i.e., one signal for one communication band.

It is more preferable that a voltage-controlled oscillator of each local oscillator has a switch circuit for bypassing a resonator circuit in part that includes an inductor and a capacitor. The switch circuit switches the resonance frequency of the resonator circuit according to the given data for setting the output frequency, and then the output frequency of the local oscillator is changed. It is further preferable that the switch circuit comprises a semiconductor device that turns on in the transmission mode and turns off in the receiving mode. Thus, each oscillated frequency can be changed easily and substantially.

DETAILED DESCRIPTION OF THE PREFERRED EMBODIMENTS

Figure 1:
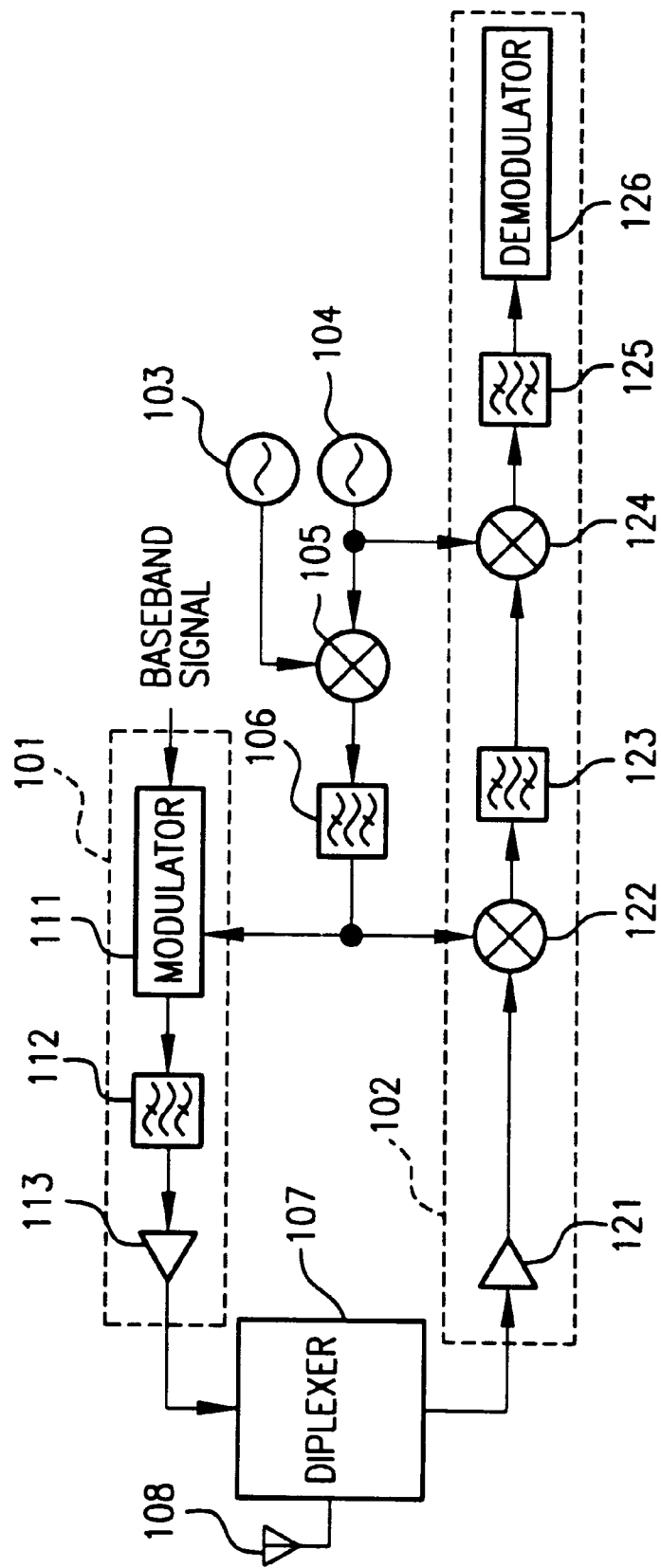
FIG. 1 is a block diagram showing a first embodiment of a transceiver circuit according to this invention.

Preferred embodiments of this invention will now be described with FIGS. 1 through 10. This transceiver circuit comprises a transmitter circuit 101, a receiver circuit 102, a first local oscillator 103, a second local oscillator 104, a local frequency converter 105, a filter 106, a diplexer 107, and an antenna 108.

The output signal of the first local oscillator 103 is mixed with the output signal of the second local oscillator 104 in the local frequency converter 105. The output signal of the local frequency converter 105 is furnished to the transmitter circuit 101 or the receiver circuit 102 after passing through the filter 106.

The transmitter circuit 101 comprises a modulator 111, a filter 112 and an amplifier 113. In a transmission mode, the modulator 111 modulates the output signal of the filter 106 with a baseband signal. The output signal of the modulator 111 is amplified by the amplifier 113 after passing the filter 112 for reducing unwanted frequency components, and goes into the air through the antenna 108.

The receiver circuit 102 comprises a low-noise amplifier 121, a first frequency converter 122, a filter 123, a second frequency converter 124, a filter 125 and a demodulator 126. In a receiving mode, a signal received by the antenna is an input to the low-noise amplifier 121 via the diplexer 107. The output signal of the low-noise amplifier 121 is an input to the first frequency converter 122, which converts the signal into a first intermediate frequency by mixing it with the output signal of the filter 106. The output signal of the first frequency converter 122 is an input to the second frequency converter 124 after passing the filter 123 for reducing unwanted frequency components. The second frequency converter 124 converts the output signal of the filter 123 into a second intermediate frequency using the output signal of the second local oscillator 104. The second intermediate frequency signal passes through the filter 125 for reducing unwanted frequency components, and then is an input to the demodulator 126.

The second local oscillator 104 comprises a frequency synthesizer whose output frequency is variable and synchronized in phase with a reference signal. In the transmission mode, the second local oscillator 104 outputs a signal having such a frequency that the output frequency of the local frequency converter 105 is equal to the frequency of the transmission signal. In the receiving mode, the second local oscillator 104 outputs a signal whose frequency varies a predetermined amount from the transmission mode and becomes such a frequency that a differential frequency between the output signal of the local frequency converter 105 and the received signal is equal to the first intermediate frequency. A reference frequency of the second local oscillator 104 is higher than a frequency step between communication channels. A frequency-switching time of the frequency synthesizer can be shortened by making the reference frequency higher. Thus, the frequency can be changed in a short period for transferring between the transmission mode and the receiving mode.

Figure 2:
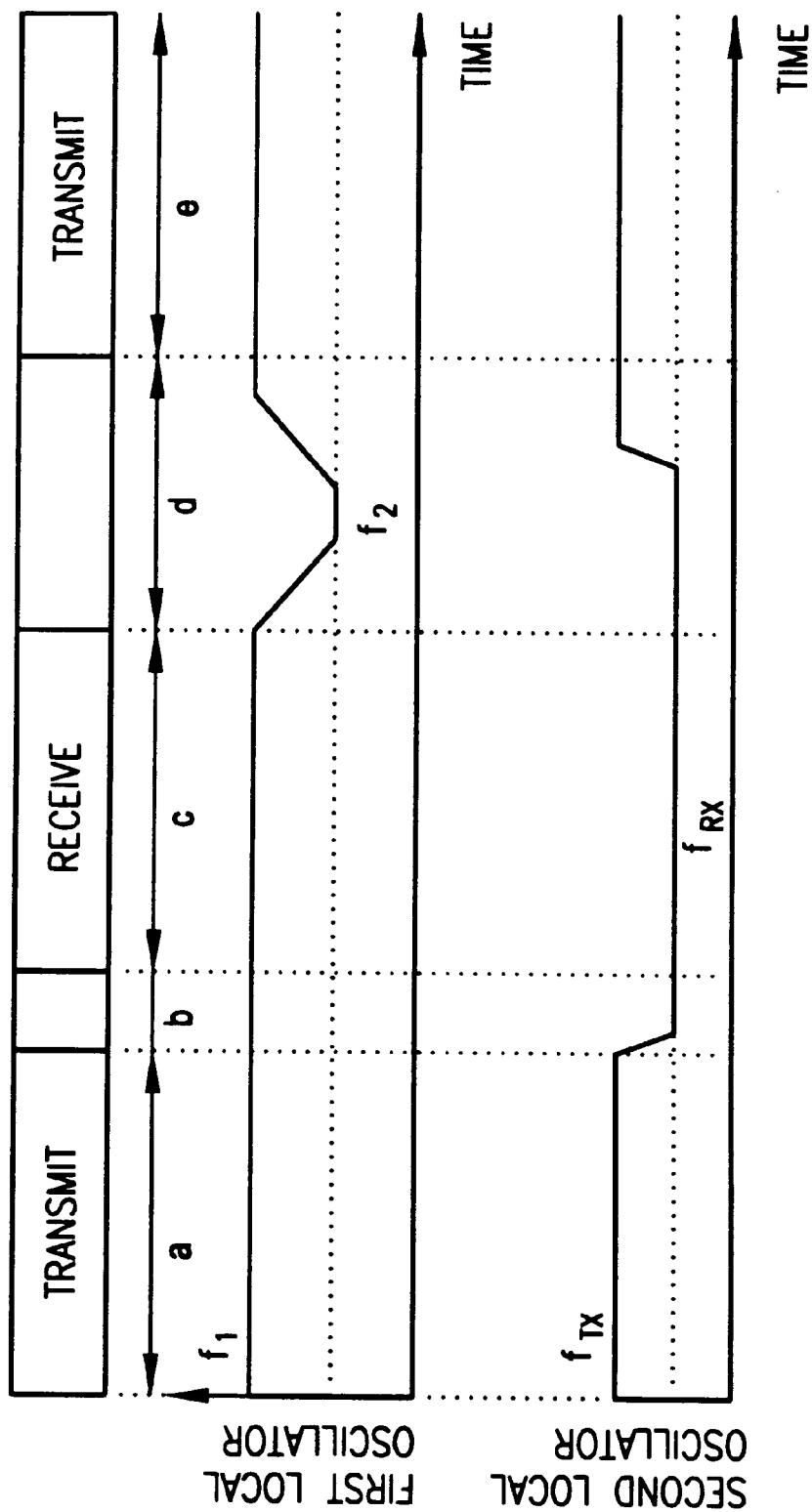
FIG. 2 is a timing chart showing an example of frequency changes of first and second local oscillators of the transceiver circuit shown in FIG. 1.

An outline of the frequency changes of the first and second local oscillators 103, 104 are shown in FIG. 2. This chart shows an example of frequency changes in the process in which the transceiver operates in a transmission mode, a receiving mode and an examining mode of signal levels in other peripheral channels, and then goes back to the transmission mode.

In the period "a" of the transmission mode, the output frequency of the first local oscillator 103 is $f_1$; the output frequency of the second local oscillator 104 is $f_{TX}$; and the frequency of the transmission signal is $f_1+f_{TX}$.

The period "b" is a switching period from the transmission mode to the receiving mode. The first local oscillator 103 maintains the frequency $f_1$, and the second local oscillator 104 changes the frequency from $f_{TX}$ to $f_{RX}$. When the first intermediate frequency is $f_{IF1}$, the frequency of the received signal is $f_1+f_{RX}-f_{IF1}$.

In the period "c" of the receiving mode, the first local oscillator 103 maintains the frequency $f_1$, and the second local oscillator maintains the frequency $f_{RX}$.

The period "d" is a period for examining signal levels of other peripheral channels. The first local oscillator 103 changes the frequency from $f_1$ to $f_2$, and returns to the frequency f1 after examining signal levels of other peripheral channels. The second local oscillator 104 maintains the frequency $f_{RX}$ until the examination of signal levels of other peripheral channels is finished, then returns to the frequency $f_{TX}$ afterward.

The period "e" is a period of transmission mode identical to the period "a".

According to the above embodiment of this invention, a high-speed switching of the frequency between the transmission mode and the receiving mode can be performed by setting the reference frequency of the second local oscillator higher than the frequency step between communication channels. Thus, a double heterodyne transceiver circuit for TDMA system can be embodied by using a single second local oscillator. This transceiver circuit does not generate unwanted spurious signals since the frequency of the second local oscillator does not exist in the transmission mode. Moreover, a circuitry that is necessary between a modulator and an antenna can be minimized as a direct modulation is performed using the frequency of the transmission signal.

Figure 3:
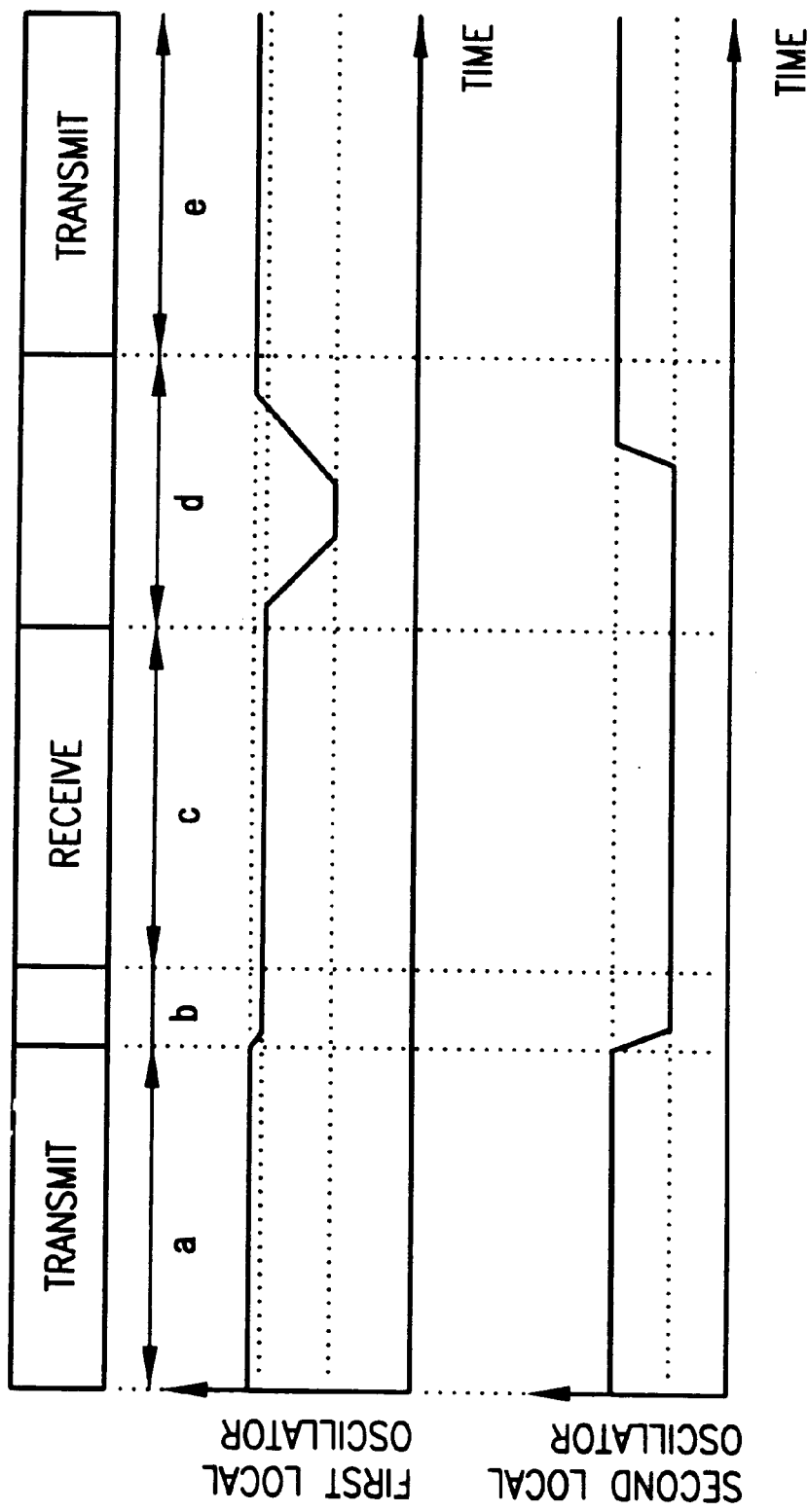
FIG. 3 is a timing chart showing another example of frequency changes of the first and second local oscillators of the transceiver circuit shown in FIG. 1.

Another example of frequency changes of the first and second local oscillators 103, 104 are shown in FIG. 3. In this case, the frequency of the first local oscillator 103 is different a certain amount between the receiving mode and the transmission mode, and the amount is set smaller than the reference frequency of the second local oscillator. In FIG. 3, the frequency of the first local oscillator changes by a certain amount and the frequency lasts till the end of the period "c" for the receiving mode. An amount of the frequency variation of the first local oscillator in the period "b" is near to the frequency step between communication channels. Therefore, a necessary time for changing the frequency in the period "b" is shorter than for changing frequency between a lowest frequency channel and a highest frequency channel.

Thus, the output frequency of the local frequency converter can be changed independently from the frequency of the second local oscillator. In some cases according to the operation of FIG. 2, it is difficult to set adequate frequencies for the first and second intermediate frequencies so that the reference frequency of the second local oscillator is set high enough. However, according to the operation of FIG. 3, it is easy to set the reference frequency of the second local oscillator high enough.

Figure 4:
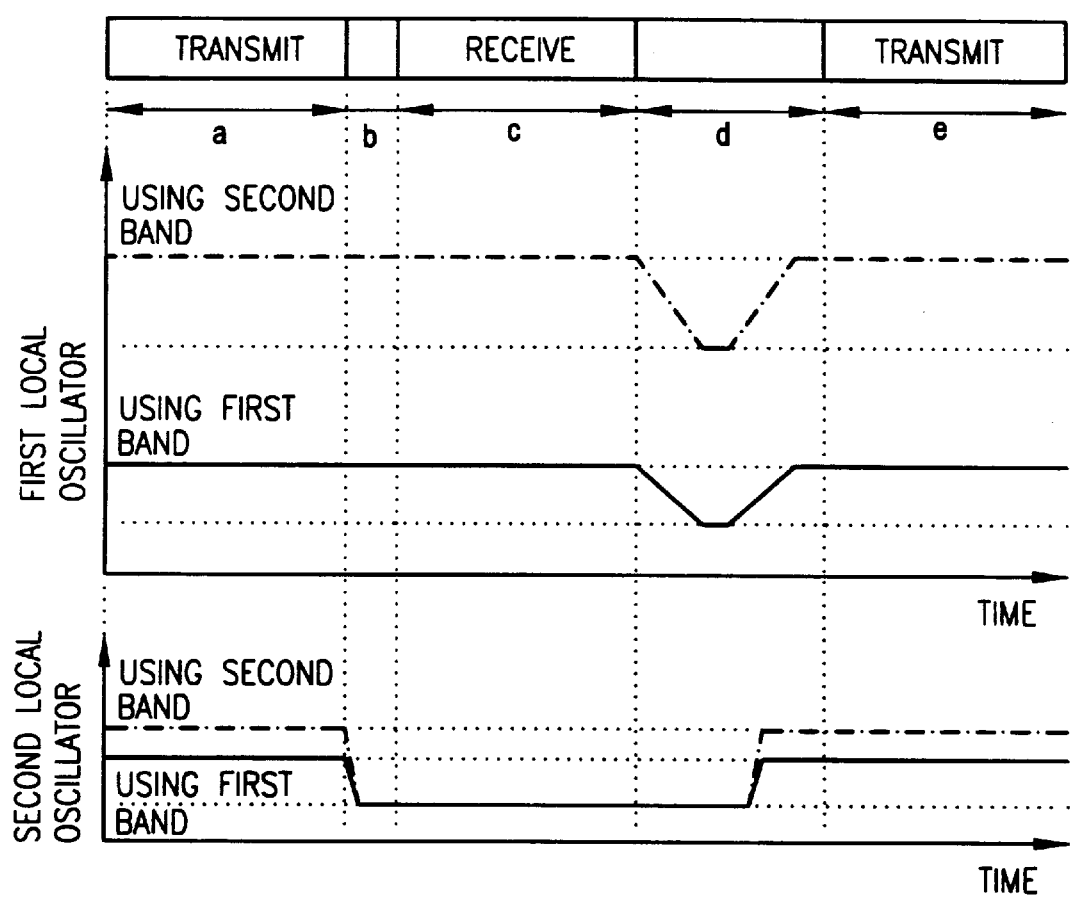
FIG. 4 is a timing chart showing another example of frequency changes of the first and second local oscillators when the transceiver circuit shown in FIG. 1 is applied to two communication bands.

Another example of frequency changes of the first and second local oscillators 103, 104 are shown in FIG. 4. In this case, the transceiver circuit shown in FIG. 1 is applied to two communication bands whose differential frequencies between the received signals and the transmission signals are different from each other. The first and second intermediate frequencies and the frequency of the second local oscillator 104 are the same in the receiving mode either in the first or the second communication band. In the transmission mode, the second local oscillator 104 changes the frequency to adapt to each communication band. Selection of the communication band between the first and second communication bands is performed basically by the frequency of the first local oscillator. Thus, according to the operation of FIG. 4, a transceiver circuit operating in two communication bands is obtained by using a single second local oscillator. It is also possible to arrange the output frequency of the second local oscillator not to change in the first communication band, and to change only in the transmission mode in the second communication band.

Figure 5:
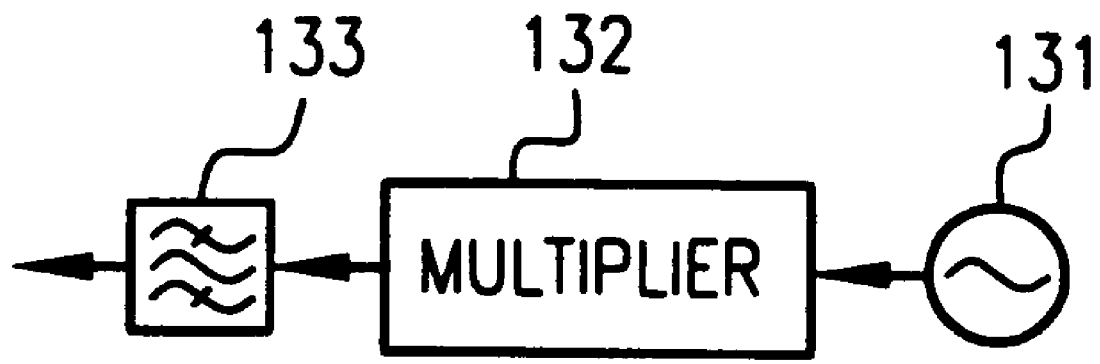
FIG. 5 is a block diagram showing a modified first local oscillator of the transceiver circuit shown in FIG. 1.

It is preferable that the first local oscillator 103 comprises, as shown in FIG. 5, a local oscillator circuit 131, a multiplier 132 that multiplies the output of the local oscillator circuit 131, and a filter 133 that reduces unwanted frequency components. In this case, an impedance fluctuation due to the time division operation of the transmitter and receiver circuits 101 and 102 is suppressed by the multiplier 132. Thus, the operation of the local oscillator 131 becomes more stable.

Figure 6:
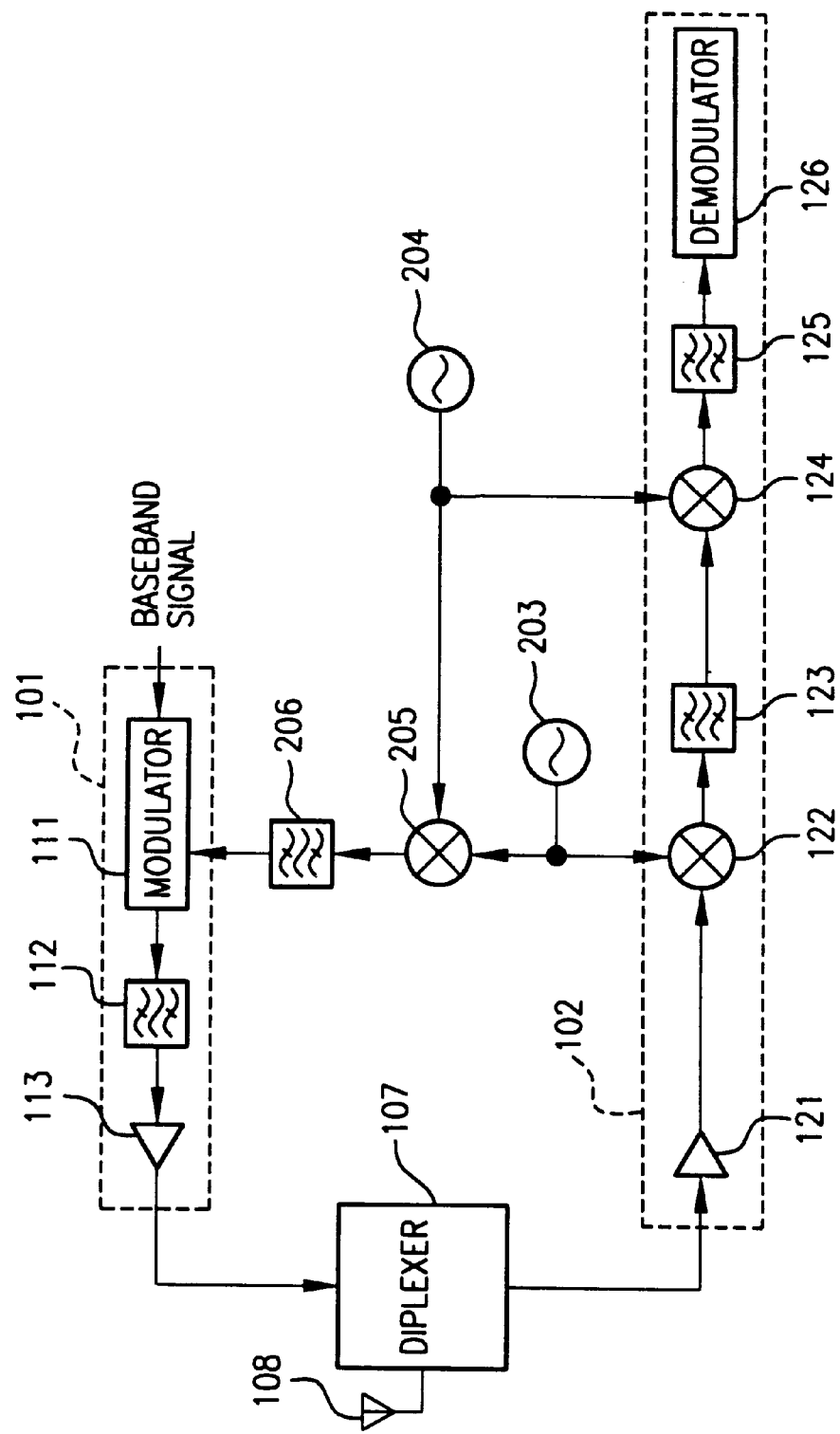
FIG. 6 is a block diagram showing a second embodiment of a transceiver circuit according to this invention.

FIG. 6 shows a second embodiment of the transceiver circuit according to this invention. Same components are indicated by same numerals as in FIG. 1. This circuit comprises a transmitter circuit 101, a receiver circuit 102, a first local oscillator 203, a second local oscillator 204, a local frequency converter 205, a filter 206, a diplexer 107, and an antenna 108.

The output signal of the first local oscillator 203 is furnished to the receiver circuit 102 in the receiving mode. While in the transmission mode, the output signal of the first local oscillator 203 is an input to the local frequency converter 205, which mixes the signal with the output frequency of the second local oscillator 204. The output of the local frequency converter 205 is furnished to the transmission circuit 101 after unwanted frequency components are reduced by the filter 206.

The second local oscillator 204 has a frequency synthesizer that synchronizes in phase with a reference signal, and whose output frequency is variable. In the transmission mode, the second local oscillator 204 outputs a signal whose frequency is such a frequency that the output frequency of the local frequency converter 205 is equal to the transmission frequency. The output frequency of the second local oscillator 204 varies a certain amount in the receiving mode from the frequency in the transmission mode. The output signal of the second local oscillator 204 is furnished to the second frequency converter 124. The reference frequency of the second local oscillator 204 is higher than the frequency step between communication channels. A frequency-switching time of the frequency synthesizer can be shortened by making the reference frequency higher. As a result, the frequency can be changed in a short period for transferring between the transmission mode and the receiving mode.

According to the second embodiment of this invention, a quick change of the frequency can be performed between the transmission mode and the receiving mode by setting the reference frequency of the second local oscillator high enough. Thus a double heterodyne transceiver for TDMA system can be obtained using a single second local oscillator. This transceiver circuit does not generate unwanted spurious signals since the frequency of the second local oscillator does not exist in the transmission mode. Moreover, circuitry that is necessary between a modulator and an antenna can be minimized as a direct modulation is performed using the frequency of the transmission signal. In addition, current consumption in the receiving mode can be minimized by detecting signals intermittently and halting the operation of the local frequency converter 205 when the transceiver is not detecting signals.

In the same way as shown in FIG. 3 of the first embodiment, the frequency of the first local oscillator in the second embodiment can be varied a little in the receiving mode. The transceiver circuit of this embodiment can also be used for two frequency bands.

Figure 7:
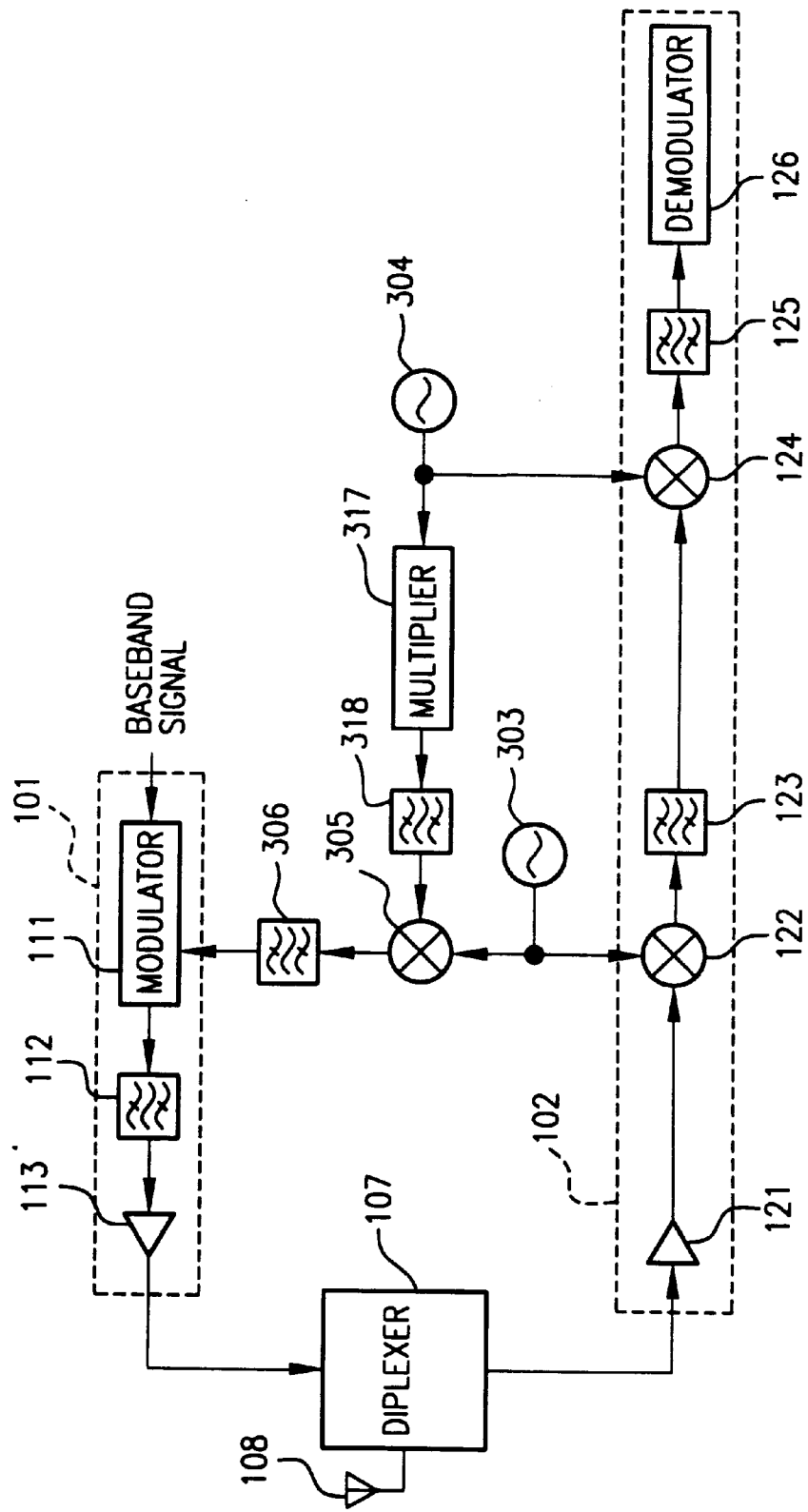
FIG. 7 is a block diagram showing a third embodiment of a transceiver circuit according to this invention.

FIG. 7 shows a third embodiment of the transceiver circuit according to this invention. This transceiver circuit has a similar configuration to that of the transceiver circuit in FIG. 6. Same components are indicated by same numerals as in FIG. 6. This transceiver circuit comprises a transmitter circuit 101, a receiver circuit 102, a first local oscillator 303, a second local oscillator 304, a multiplier 317, a local frequency converter 305, a filter 318, a filter 306, a diplexer 107, and an antenna 108.

The frequency of the first local oscillator 303 and the transmission frequency are different from each other, and a mean value of them is equal to the frequency of the received signal. The output signal of the first local oscillator 303 is an input to the receiver circuit 102 in the receiving mode. While in the transmission mode, the output signal of the first local oscillator 303 is an input to the local frequency converter 305, which mixes the signal with a multiplied frequency of the output signal of the second local oscillator. The output of the local frequency converter 305 is an input to the filter 306 in which unwanted frequency components are reduced. Then, the output signal of the filter is provided to the transmitter circuit 101.

The second local oscillator 304 has a frequency synthesizer that synchronizes in phase with the reference signal, and whose output frequency is variable. In the transmission mode, the output frequency of the second local oscillator 304 varies a certain amount, and is doubled by the multiplier 317. Then, the output signal of the multiplier 317 is an input to the local frequency converter 305 after unwanted frequency components are reduced by the filter 318. The local frequency converter 305 mixes the output frequency of the first local oscillator 303 and the output frequency of the filter 318. The output signal of the local frequency converter 305 is an input to the modulator 111 after unwanted frequency components are reduced by the filter 306. In the receiving mode, the output signal of the second local oscillator is an input to the second frequency converter 124.

The reference frequency of the second local oscillator 304 is higher than the frequency step of communication bands. A frequency-switching time of the frequency synthesizer can be shortened by making the reference frequency higher. Therefore, the frequency can be changed in a short period for transferring between the transmission mode and the receiving mode.

According to the third embodiment of this invention, a quick change of the frequency can be performed between the transmission mode and the receiving mode by setting the reference frequency of the second local oscillator high enough. Thus a double heterodyne transceiver for TDMA system can be obtained using a single second local oscillator. This transceiver circuit does not generate unwanted spurious signal since the frequency of the second local oscillator does not exist in the transmission mode. Moreover, a circuitry that is necessary between a modulator and an antenna can be minimized as a direct modulation is performed using the frequency of the transmission signal. Current consumption in the receiving mode can also be minimized by detecting signals intermittently and halting the operation of the multiplier and the local frequency converter 305 when the transceiver is not detecting signals. The frequency of the second local oscillator 304 varies such little amount as the second intermediate frequency between the transmission and receiving modes, so a switching time of the frequency can be substantially shortened.

In the same way as shown in FIG. 3 of the first embodiment, the frequency of the first local oscillator in the second embodiment can be varied a little at receiving mode. The transceiver circuit of this embodiment can also be used for two frequency bands as in FIG. 4.

Figure 8:
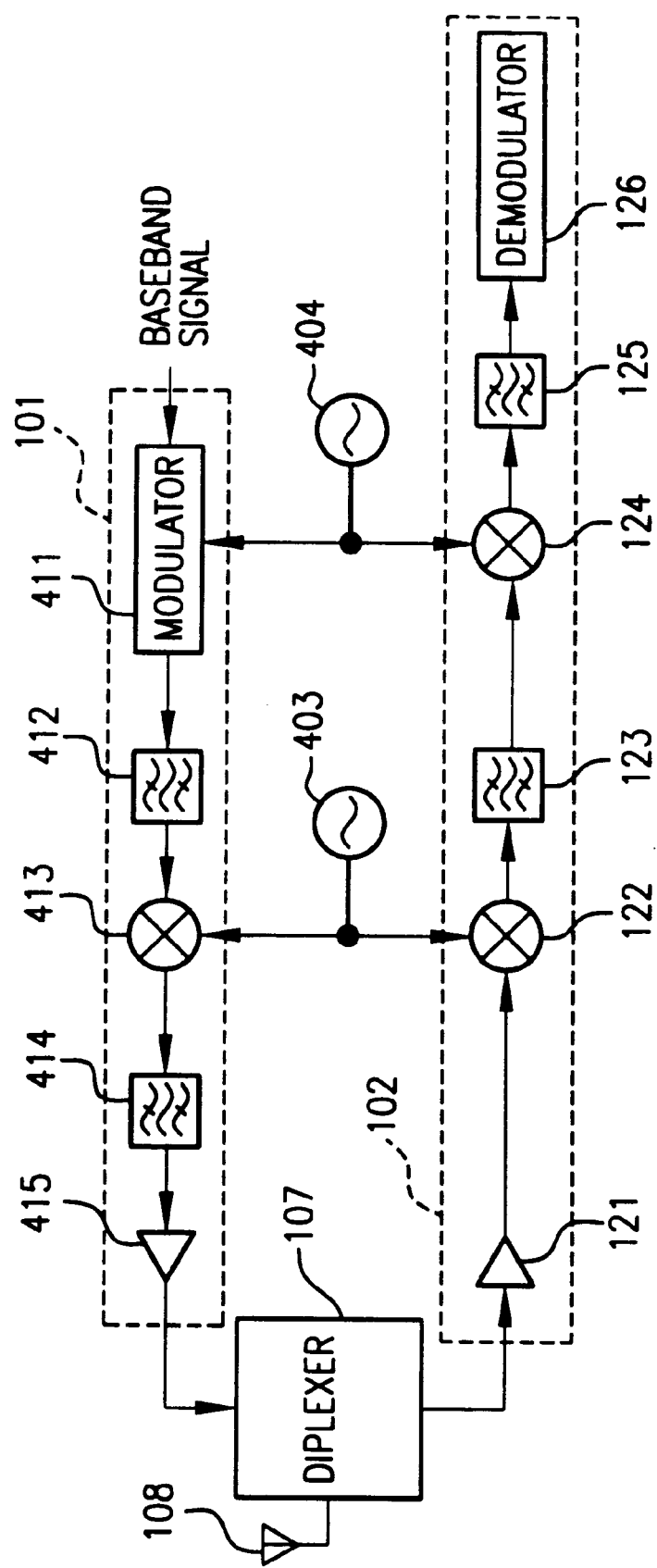
FIG. 8 is a block diagram showing a fourth embodiment of a transceiver circuit according to this invention.

FIG. 8 shows a fourth embodiment of the transceiver circuit according to this invention. Same components are indicated by same numerals as in FIG. 1. This transceiver circuit comprises a transmitter circuit 101, a receiver circuit 102, a first local oscillator 403, a second local oscillator 404, a diplexer 107, and an antenna 108.

The transmitter circuit 101 comprises a modulator 411, a filter 412, a transmission frequency converter 413, a filter 414, and an amplifier 415. At the transmission mode, the modulator 411 modulates the output signal of the second local oscillator 404 with the baseband signal. The output signal of the modulator 411 is an input to the transmission frequency converter 413 after unwanted frequency components are reduced by the filter 412. The transmission frequency converter 413 produces a converted signal whose frequency is equal to that of the transmission signal, using the output signal of the first local oscillator 403. The output signal of the transmission frequency converter 413 is amplified by the amplifier 415 after unwanted frequency components are reduced. Then the output signal of the amplifier 415 passes the diplexer and radiates into the air from the antenna.

The receiver circuit in this embodiment has the same configuration as the receiver circuit in FIG. 1. The output signal of the first local oscillator 403 is an input to the first frequency converter 122, and the output signal of the second local oscillator 404 is an input to the second frequency converter 124.

The second local oscillator 404 comprises a frequency synthesizer that synchronizes in phase with the reference signal and whose output frequency is variable. In the receiving mode, the frequency of the second local oscillator 404 varies a certain amount from the frequency in the transmission mode, and the output signal is an input to the second local frequency converter 124. The reference frequency of the second local oscillator 404 is higher than the frequency step between communication bands. A frequency-switching time of the frequency synthesizer can be shortened by making the reference frequency higher. Thus, the frequency can be changed in a short period for transferring between the transmission mode and the receiving mode.

According to the fourth embodiment of this invention, a quick change of the frequency can be performed between the transmission mode and the receiving mode by setting the reference frequency of the second local oscillator high enough. Thus a heterodyne transceiver for TDMA system can be obtained using a single second local oscillator. This transceiver circuit does not generate unwanted spurious signal as the frequency of the second local oscillator does not exist in the transmission mode. This transceiver circuit can also obtain a good modulation characteristics as the modulation is performed using a low frequency of the second local oscillator in the transmission mode. The transceiver circuit of this embodiment can also be used for two frequency bands as in FIG. 4 of the first embodiment.

Figure 9:
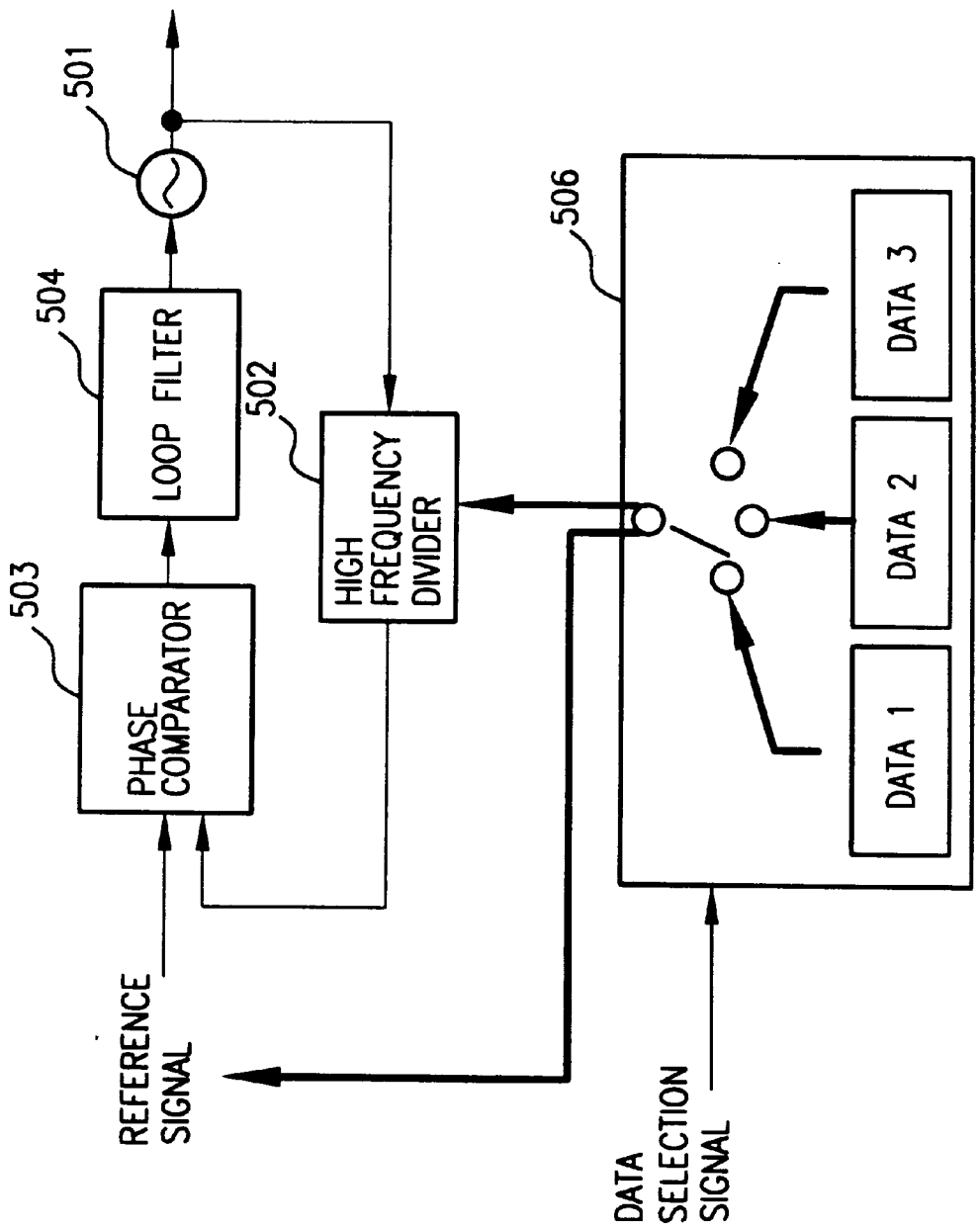
FIG. 9 is a block diagram showing an example of a second local oscillator.

In the above first through fourth embodiments, the second local oscillator can be made as shown in FIG. 9. A voltage-controlled oscillator 501, a high frequency divider 502, a phase comparator 503 and a loop filter 504 forms a phase-synchronizing loop. A data switch 506 stores data for setting output frequencies. One of the data is selected according to a data selection signal given from outside. Thus, a dividing ratio of a reference divider that divides a reference signal and a dividing ratio of the high frequency divider 502 that divides an output of the voltage-controlled oscillator 501 are set. The plural data for setting output frequencies enable the data switch 506 to switch the output frequency of the second local oscillator by one or two data selection signals in single or double communication bands.

Figure 10:
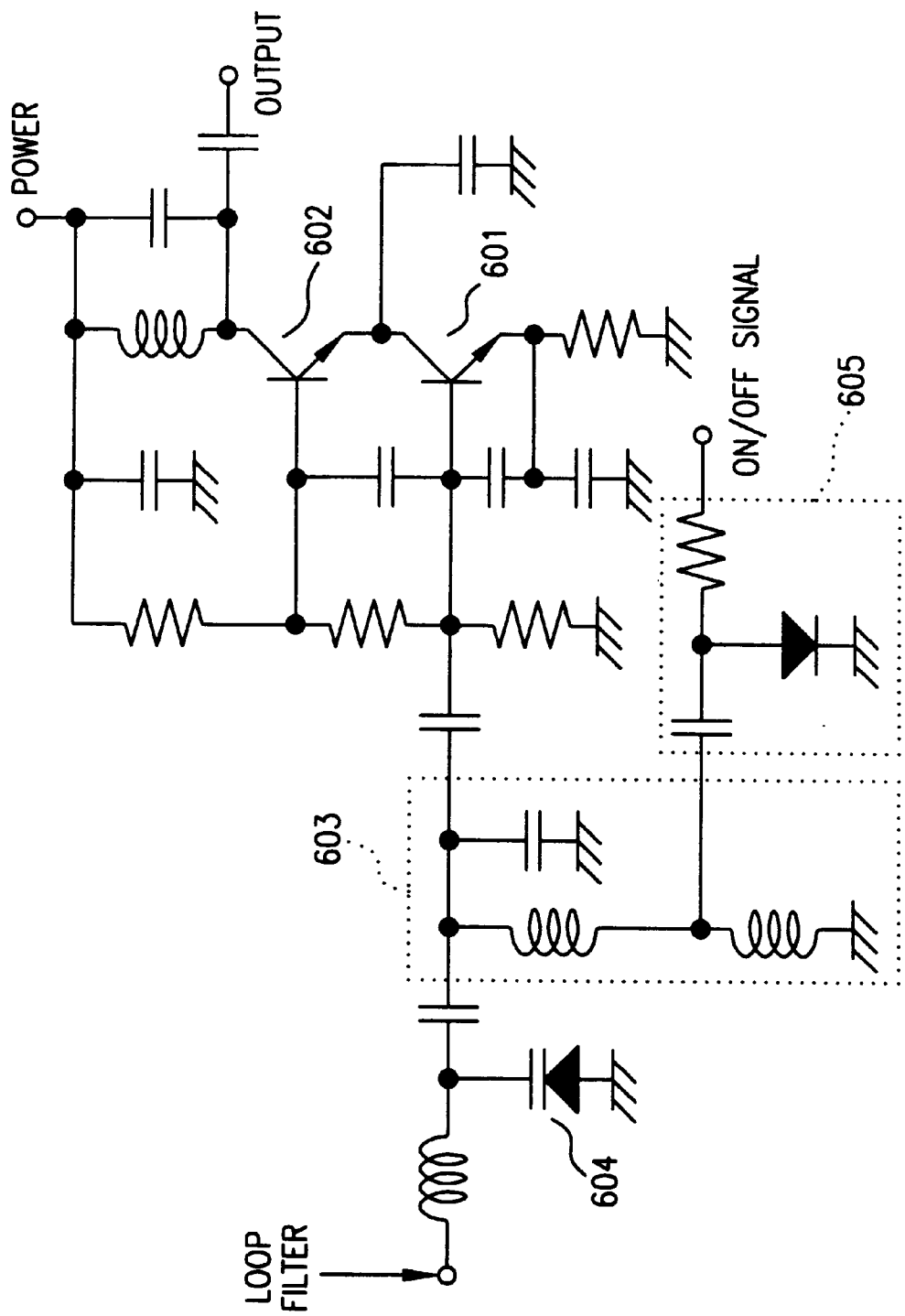
FIG. 10 is a circuit diagram showing an example of a voltage-controlled oscillator of the second local oscillator.
Figure 11:
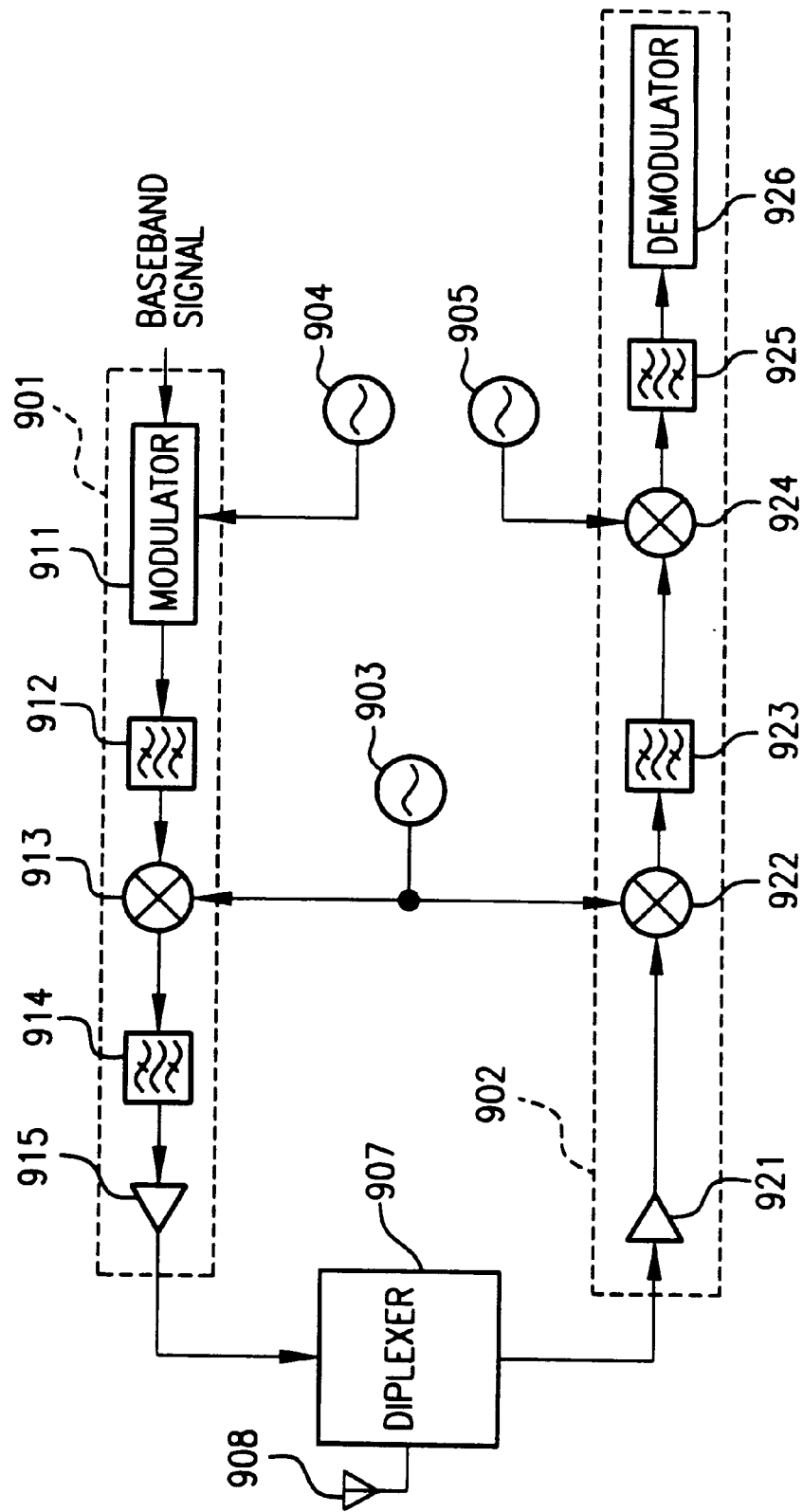
FIG. 11 is a block diagram showing a transceiver circuit in the prior art.

The voltage-controlled oscillator included in the second local oscillator can be made as shown in FIG. 10. This circuit is an example in the case that the frequency of the second local oscillator is lower in the receiving mode than in the transmission mode. A transistor 601 is for oscillation and a transistor 602 is for amplification. A variable capacitance diode 604 varies its capacitance by a voltage applied by the loop filter 504. A base terminal of the transistor 601 connects to a resonator circuit 603 and the variable capacitance diode 604. An oscillation frequency is varied according to a resonance frequency determined by the resonator circuit 603 and the capacitance of the variable capacitance diode 604.

The resonator circuit 603 comprises an inductor and a capacitor. A switch circuit 605 using a diode is provided. In the receiving mode, the switch circuit 605 is off so that the resonance frequency of the resonator circuit 603 is low. In the transmission mode, the switch 605 turns on and the inductor of the resonance circuit 603 is shortened in part so that the resonance frequency of the resonator circuit 603 becomes higher. Thus, the oscillation frequency is substantially varied.

The first local oscillator may also include the voltage-controlled oscillator such as shown in FIG. 10. In this case, a large amount of frequency variation can be obtained that is necessary in the application of two communication bands shown in FIG. 4.

As explained above, the transceiver circuit according to this invention uses a single second local oscillator with changing the output frequency thereof during a short period for transfer between the transmission mode and the receiving mode in the TDMA system. Therefore, it is suitable for a compact size. Moreover, the transceiver circuit of this invention hardly generates unwanted spurious components as the output signal of the second local oscillator does not exist in the transmission mode.

In addition to above explanation, plural antennas can be equipped and a multiplexer can be used instead of the diplexer. Other embodiments may be carried out within the scope of the appended claims.

What is claimed is:

1. A transceiver circuit for use with a time division multiple access system, the transceiver circuit comprising:
    a first local oscillator for generating a first local frequency signal;
    a second local oscillator comprising a frequency synthesizer having a reference frequency that is higher than a frequency channel step, and generating a second local frequency signal having a frequency dependent on whether the transceiver circuit is in the transmitting mode or the receiving mode;
    a heterodyne receiver circuit comprising:
        a first frequency converter for converting a received signal into a first intermediate frequency signal, and
        a second frequency converter for converting the first intermediate frequency signal into a second intermediate frequency signal having a frequency equal to a differential frequency between the first intermediate frequency and the second local frequency signal; and
    a transmitter circuit.

2. The transceiver circuit of claim 1,
    wherein the frequency of the second local frequency signal varies by a predetermined amount between the transmitting and the receiving modes, and wherein the transmitter circuit has a modulator for receiving a carrier frequency signal and providing a transmission signal based on the frequency of the carrier frequency signal when the transceiver circuit is in the transmitting mode, the transceiver circuit further comprising:
        a local frequency converter for receiving the first and second local frequency signals and furnishing the carrier frequency signal to the modulator when the transceiver circuit is in the transmitting mode and for interacting with the first frequency converter to convert the received signal into the first intermediate signal when the transceiver circuit is in the receiving mode.

3. The transceiver circuit of claim 2, wherein the first local oscillator includes:
    a first oscillator circuit for furnishing an output signal; and
    a multiplier for generating the first local frequency signal by multiplying the frequency of the output signal.

4. The transceiver circuit of claim 1, wherein the first frequency converter receives the first local frequency signal when the transceiver circuit is in the receiving mode and converts the received signal into the first intermediate signal based on the first local frequency signal and the received signal, wherein the frequency of the second local frequency signal varies by a predetermined amount between the transmitting and the receiving modes, and wherein the transmitter circuit has a modulator for receiving a carrier frequency signal and providing a transmission signal based on the frequency of the carrier frequency signal when the transceiver circuit is in the transmitting mode, the transceiver circuit further comprising:
    a local frequency converter for receiving the first and second local frequency signals and for furnishing the carrier frequency signal to the modulator when the transceiver circuit is in the transmitting mode.

5. The transceiver circuit of claim 4, wherein the mean value of the frequency of the first local frequency signal and the frequency of the carrier frequency signal is indicative of the frequency of the received signal, and wherein the second local oscillator includes:
    an oscillator circuit for furnishing the second local frequency signal to the second frequency converter when the transceiver circuit is in the receiving mode; and
    a multiplier for doubling the frequency of the output signal of the oscillator circuit for generating the second local frequency signal when the transceiver circuit is in the transmitting mode.

6. The transceiver circuit of claim 1, wherein the first frequency converter converts the received signal into the first intermediate signal based on the first local frequency signal and the received signal when the transceiver circuit is in the receiving mode, wherein the frequency of the second local frequency signal varies by a predetermined amount between the transmitting and the receiving modes, wherein the transmitter circuit has a modulator for receiving the second local frequency signal and a modulating signal and for generating a modulated signal from the modulating signal based on the frequency of the second local frequency signal when the transceiver circuit is in the transmitting mode, the transceiver circuit further comprising:

a transmission frequency converter for receiving the modulated signal and the first local frequency signal and for generating a transmission frequency signal from the modulated signal based on the frequency of the first local frequency signal and the second local frequency signal.

7. The transceiver circuit of claim 1, wherein the transceiver circuit is capable of being used in plural communication bands, wherein each communication band has predetermined differences in frequency between receiving and transmission signals, wherein one of the plural communication bands is selected according to the frequency of the first local frequency signal, and wherein the frequency of the second local frequency signal is fixed when the transceiver circuit is in the receiving mode and varies according to the frequency of each communication band when the transceiver circuit is in the transmitting mode.

8. The transceiver circuit of claim 7, wherein the first local oscillator includes a voltage controlled oscillator having: a resonator circuit including an inductor and a capacitor; and a switch circuit connected to selectively shunt a part of the resonator circuit to vary the frequency of the first local frequency signal to be suitable for each communication band.

9. The transceiver circuit of claim 8, wherein the switch circuit comprises semiconductor device connected to turn off when the transceiver circuit is in the receiving mode and turn on when the transceiver circuit is in the transmitting mode.

10. The transceiver circuit of claim 1, wherein the frequency of the first local frequency signal in the receiving mode differs from the frequency of the first local frequency signal in the transmitting mode based on the frequency of the received signal and the frequency of the transmission signal forming one frequency channel, and wherein the difference is smaller than the reference frequency of the frequency synthesizer of the second local oscillator.

11. The transceiver circuit of claim 1, wherein a signal furnished by the transceiver circuit is in the transmitting or the receiving mode, and wherein the second local oscillator stores data for selecting the output frequency of the second local frequency signal depending on whether the transceiver circuit is in the transmitting or the receiving mode.

12. The transceiver circuit of claim 11, wherein the second local oscillator includes a voltage controlled oscillator having: a resonator circuit including an inductor and a capacitor; and a switch circuit connected to selectively shunt a part of the resonator circuit to vary the frequency of the second local frequency signal based upon stored data.

13. The transceiver circuit of claim 12, wherein the switch circuit comprises semiconductor device connected to turn off when the transceiver circuit is in the receiving mode and turn on when the transceiver circuit is in the transmitting mode.

* * * * *